(12) United States Patent
Nakamura et al.

(10) Patent No.: US 11,784,117 B2
(45) Date of Patent: Oct. 10, 2023

(54) WIRING BOARD, ELECTRONIC DEVICE, AND ELECTRONIC MODULE

(71) Applicant: KYOCERA Corporation, Kyoto (JP)

(72) Inventors: Kazushi Nakamura, Kyoto (JP); Hidehisa Umino, Kyoto (JP); Yousuke Moriyama, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 224 days.

(21) Appl. No.: 17/433,363

(22) PCT Filed: Feb. 26, 2020

(86) PCT No.: PCT/JP2020/007713
§ 371 (c)(1),
(2) Date: Aug. 24, 2021

(87) PCT Pub. No.: WO2020/175541
PCT Pub. Date: Sep. 3, 2020

(65) Prior Publication Data
US 2022/0148956 A1    May 12, 2022

(30) Foreign Application Priority Data

Feb. 27, 2019 (JP) .................................. 2019-034415
Aug. 27, 2019 (JP) .................................. 2019-154733

(51) Int. Cl.
*H01L 23/498* (2006.01)
*H01L 23/13* (2006.01)
(Continued)

(52) U.S. Cl.
CPC .. *H01L 23/49838* (2013.01); *H01L 23/49805* (2013.01); *H01L 23/49827* (2013.01);
(Continued)

(58) Field of Classification Search
CPC ..................... H01L 23/49827; H01L 23/49805
See application file for complete search history.

(56) References Cited

U.S. PATENT DOCUMENTS 5,285,352 A * 2/1994 Pastore ............... H01L 23/3677
257/E23.101
2007/0018190 A1   1/2007 Kim et al.
(Continued)

FOREIGN PATENT DOCUMENTS

JP     2007-027752 A    2/2007
JP     2013-232610 A   11/2013
(Continued)

*Primary Examiner* — Sherman Ng
(74) *Attorney, Agent, or Firm* — Volpe Koenig

(57) ABSTRACT

A wiring board includes an insulating substrate including a first surface and a mounting portion for an electronic component on the first surface, the insulating substrate having a rectangular shape in a plan view of the first surface; a via conductor located inside the insulating substrate and at a corner portion of the insulating substrate in a plane perspective, and extending in a thickness direction of the insulating substrate; a wiring conductor located on the first surface and connecting the mounting portion and the via conductor to each other; and a heat dissipation portion located inside the insulating substrate at a position overlapping the mounting portion in a plane perspective view, wherein the first surface includes, between the heat dissipation portion and the via conductor in a plane perspective view, a first region surrounded by the wiring conductor in a plan view.

14 Claims, 12 Drawing Sheets

(51) Int. Cl.
*H01L 23/373* (2006.01)
*H01L 23/00* (2006.01)

(52) U.S. Cl.
CPC .......... *H01L 23/13* (2013.01); *H01L 23/3736* (2013.01); *H01L 24/16* (2013.01); *H01L 2224/16227* (2013.01)

(56) References Cited

U.S. PATENT DOCUMENTS

| | | | |
|---|---|---|---|
| 2014/0196934 A1* | 7/2014 | Kawagoe | H05K 1/0209 |
| | | | 174/252 |
| 2017/0263546 A1* | 9/2017 | Lin | H05K 1/0204 |
| 2018/0116055 A1 | 4/2018 | Murakami | |
| 2019/0182997 A1* | 6/2019 | Lin | H01L 23/49822 |
| 2019/0267307 A1* | 8/2019 | Lin | H01L 23/3737 |

FOREIGN PATENT DOCUMENTS

| | | |
|---|---|---|
| JP | 2013-243256 A | 12/2013 |
| JP | 2014-157949 A | 8/2014 |
| JP | 2015-225963 A | 12/2015 |
| JP | 2016-103518 A | 6/2016 |
| JP | 2018-073905 A | 5/2018 |

* cited by examiner

WIRING BOARD, ELECTRONIC DEVICE, AND ELECTRONIC MODULE

TECHNICAL FIELD

The present invention relates to a wiring board, an electronic device, and an electronic module.

BACKGROUND ART

A known wiring board includes an electronic component mounted on a main surface of an insulating substrate made of a ceramic.

The wiring board described above includes an insulating substrate including a cutout portion that has a long side in the side direction and that opens to the main surface and a side surface, an inner-face electrode located on an inner surface of the cutout portion, and a wiring conductor provided on the surface and inside of the insulating substrate connected to the inner-face electrode (Japanese application publication No. 2013-232610).

SUMMARY

A wiring board according to the present disclosure includes an insulating substrate including a first surface and a mounting portion for an electronic component on the first surface, the insulating substrate having a rectangular shape in a plan view of the first surface; a via conductor located inside the insulating substrate and at a corner portion of the insulating substrate in a plane perspective view and extending in a thickness direction of the insulating substrate; a wiring conductor located on the first surface and connecting the mounting portion and the via conductor to each other; and a heat dissipation portion located inside the insulating substrate at a position overlapping the mounting portion in a plane perspective view, wherein the first surface includes, between the heat dissipation portion and the via conductor in a plane perspective, a first region surrounded by the wiring conductor in a plan view.

An electronic device according to the present disclosure includes an electronic component on the mounting portion of the wiring board with the configuration described above.

An electronic module of the present disclosure includes a module board and the electronic device with the configuration described above connected to the module board.

DESCRIPTION OF EMBODIMENTS

Several exemplary embodiments of the present disclosure will be described with reference to the accompanying drawings.

First Embodiment

Figure 1A:
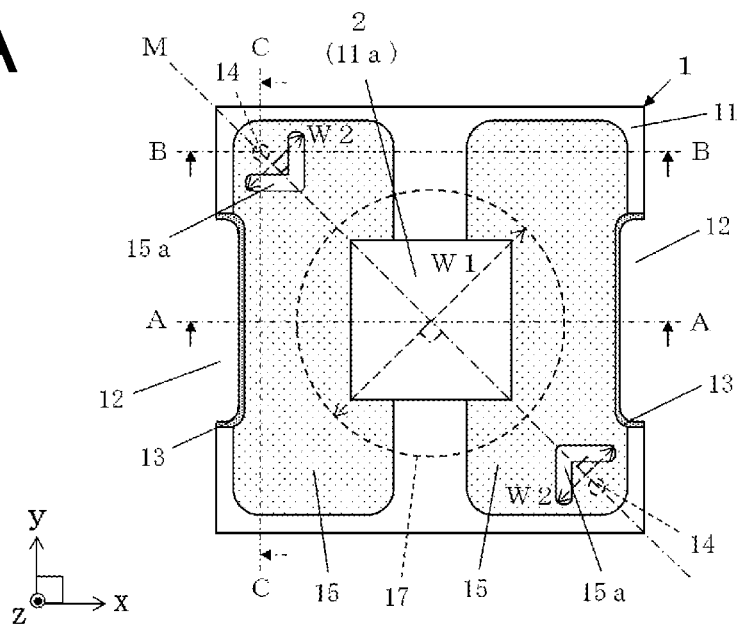
FIG. 1A is a top view of an electronic device according to a first embodiment.
Figure 1B:
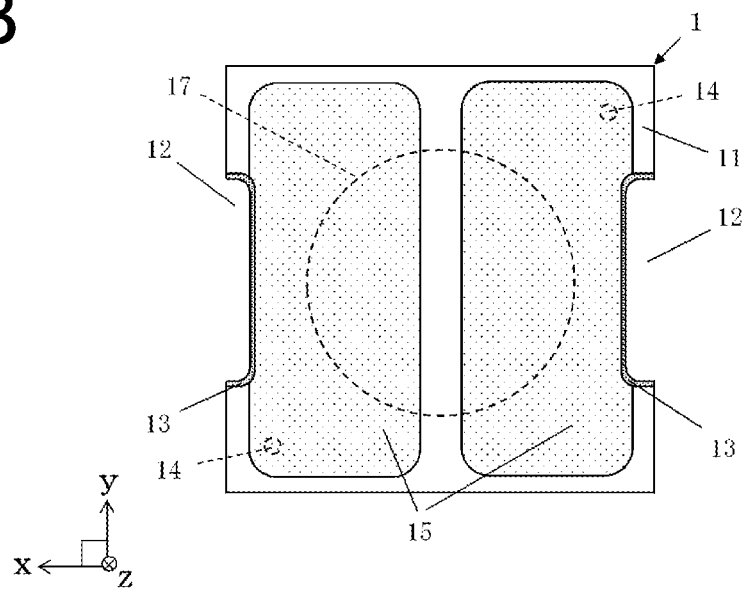
FIG. 1B is a bottom view of FIG. 1A.
Figure 2:
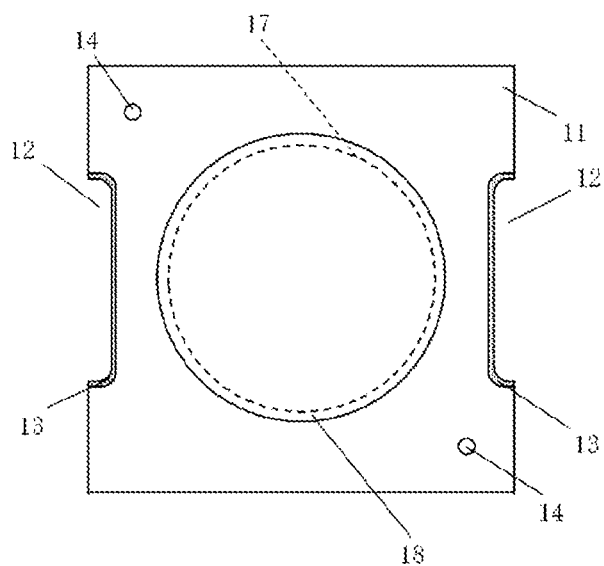
FIG. 2 is an internal top view of a wiring board in the electronic device illustrated in FIG. 1.
Figure 2:
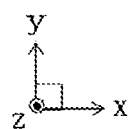
Figure 3A:
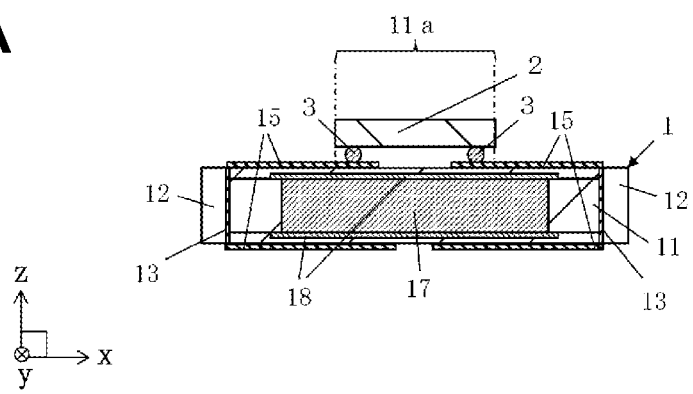
FIG. 3A is a cross-sectional view taken along line A-A of the electronic device illustrated in FIG. 1A.
Figure 3B:
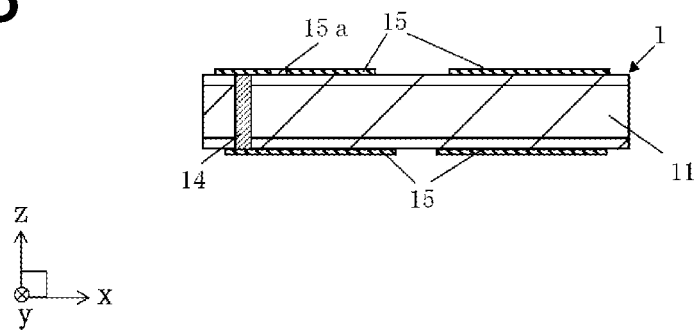
FIG. 3B is a cross-sectional view taken along line B-B of the electronic device illustrated in FIG. 1A.
Figure 3C:
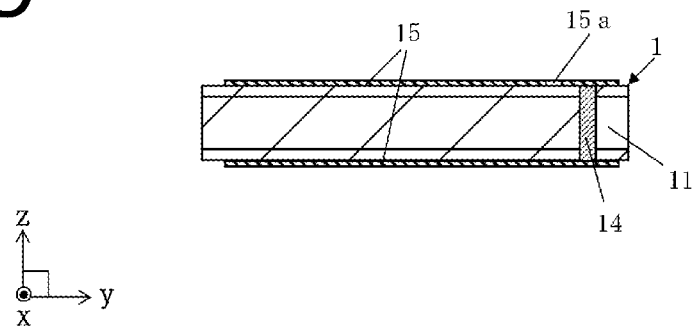
FIG. 3C is a cross-sectional view taken along line C-C of the electronic device illustrated in FIG. 1A.

As illustrated in the example illustrated in FIGS. 1 to 3, a wiring board 1 according to the first embodiment includes an insulating substrate 11, via conductors 14 with both end portions located in a thickness direction of the insulating substrate, and wiring conductors 15 located on the surface and inside of the insulating substrate 11. The wiring board 1 includes a mounting portion 11a for mounting an electronic component 2 in a center portion in a plan view. An electronic device includes the wiring board 1 and the electronic component 2 mounted on the mounting portion 11a of the wiring board 1. The electronic device is connected, for example, to a connection pad on a module board constituting an electronic module by using a bonding material.

The wiring board 1 according to the present embodiment includes the insulating substrate 11 including a first surface (main surface), having a rectangular shape in a plan view of the first surface, and including the mounting portion 11a for the electronic component 2 on the first surface, the via conductors 14 located inside the insulating substrate 11 and at corner portions in a plane perspective view and extending in the thickness direction of the insulating substrate 11, the wiring conductors 15 located on the first surface and connecting the mounting portion 11a and the via conductors 14 to each other, and a heat dissipation portion 17 located inside the insulating substrate 11 at a position overlapping the mounting portion 11a in a plane perspective view. The first surface includes, between the heat dissipation portion 17 and the via conductors 14 in a plane perspective, first regions 15a surrounded by the wiring conductors 15 in a plan view.

In FIGS. 1 to 3, an upward direction is defined as a positive direction along a virtual Z axis. Note that the terms "up/top" and "down/bottom" are used in the following description by way of convenience and should not be construed as limitations in the actual use of the wiring board 1 and the like.

Surface electrodes 13 are illustrated hatched in the example illustrated in FIGS. 1 and 2. In the example illustrated in FIGS. 1 and 2, regions where the side surfaces of the via conductors 14 overlap with the wiring conductors 15 are illustrated as dotted lines. The wiring conductors 15 are illustrated hatched in the example illustrated in FIGS. 1 and 2.

The insulating substrate 11 includes the first surface (the top surface in FIGS. 1 to 3), a second surface (side surface) connected to the first surface, and a third surface (bottom surface in FIGS. 1 to 3) on the opposite side to the first surface in the thickness direction. The insulating substrate 11 includes a plurality of insulating layers, and the insulating substrate 11 has a rectangular shape when viewed from a plan view, that is, when viewed from a direction perpendicular to the first surface. The insulating substrate 11 functions as a support for supporting the electronic component 2. The insulating substrate 11 includes, in a center portion, the mounting portion 11a for mounting the electronic component 2 on the first surface side in a plan view.

The insulating substrate 11 may, for example, be made from a ceramic, such as an aluminum oxide-based sintered body (i.e., alumina ceramic), an aluminum nitride-based sintered body, a silicon nitride-based sintered body, a mullite-based sintered body, or a glass ceramic sintered body. In a case where the insulating substrate 11 is, for example, an aluminum oxide-based sintered body, a slurry is produced by adding a suitable organic binder, solvent, and the like to a raw material powder of aluminum oxide ($Al_2O_3$), silicon oxide ($SiO_2$), magnesium oxide (MgO), and calcium oxide (CaO), or the like, and then mixing them. A ceramic green sheet is produced by forming the slurry described above into a sheet using a known doctor blade method, calender roll method, or the like. Next, a suitable punching process is performed on the ceramic green sheet described above, and a plurality of ceramic green sheets are laminated to form a green body, and the insulating substrate 11 is fabricated by firing the green body at a high temperature (approximately 1400° C.).

Recessed portions 12 are provided on the side surfaces of the insulating substrate 11 so as to be open on the third surface and the second surface of the insulating substrate 11, and are located on the side portions. In the example illustrated in FIGS. 1 and 2, the recessed portions 12 are formed in a rectangular shape with arcuate corner portions in a plan view. Moreover, in a plan view, the recessed portions 12 may have a semi-ovoid shape, a semi-elliptical shape, or a rectangular shape with a plurality of level differences. The recessed portions 12 have a shape elongated along the side direction of the insulating substrate 11. The recessed portions 12 are greater in width than in depth. The recessed portions 12 may be provided extending from the first surface of the insulating substrate 11 to the second surface and the third surface, as in the example illustrated in FIGS. 1 to 3, or may be provided extending from the middle of the second surface of the insulating substrate 11 to the first surface or the third surface. The recessed portions 12 described above are provided by forming through-holes that serve as the recessed portions 12 at a plurality of positions of the ceramic green sheets for the insulating substrate 11 using laser processing or punching using a die or the like.

As in the example illustrated in FIGS. 1 to 3, the surface electrodes 13 are located on the inner surfaces of the recessed portions 12 and are located in the thickness direction of the insulating substrate 11. The via conductors 14 are located on the corner portion sides of the insulating substrate 11 and are located in the thickness direction of the insulating substrate 11. The wiring conductors 15 are located on the first surface, the third surface, and the inside of the insulating substrate 11. The surface electrodes 13 and the via conductors 14 are electrically connected to the wiring conductors 15. The surface electrodes 13, the via conductors 14, and the wiring conductors 15 are for electrically connecting the electronic component 2 mounted on the wiring board 1 and an external module board to each other.

The surface electrodes 13, the via conductors 14, and the wiring conductors 15 are made by metallizing a metal powder of tungsten (W), molybdenum (Mo), manganese (Mn), silver (Ag), copper (Cu), or the like. When a metal material with a high melting point, such as W or Mo, is used, the metal material may be mixed or alloyed with Cu.

For example, a metallized paste for the surface electrodes 13 or the wiring conductors 15 is printed and applied, by a printing method such as a screen printing method, on a ceramic green sheet for the insulating substrate 11, and the applied paste is fired together with the ceramic green sheet for the insulating substrate 11 so as to form the surface electrodes 13 or the wiring conductors 15. Moreover, for example, through-holes for the via conductors 14 are formed, by a processing method, such as punching via a die or a punch, laser processing, or the like, on the ceramic green sheet for the insulating substrate 11, the through-holes are filled with a metallized paste for the via conductors 14 by the printing method described above, and this is fired together with the ceramic green sheet for the insulating substrate 11 so as to form the via conductors 14. This metallized paste is produced so as to have an appropriate viscosity by adding a suitable solvent and binder to the metal powder described above, and kneading the mixture. Note that the metallized paste may also include glass powder or ceramic powder in order to increase the bonding strength with the insulating substrate 11.

In a plane perspective view, as in the example illustrated in FIGS. 1 and 2, a first region 15a is located in each wiring conductor 15 to surround the region located between the heat dissipation portion 17 and the via conductor 14. The wiring conductor 15 is not located in the first region 15a. The first region 15a is located on a virtual straight line M that connects the heat dissipation portion 17 and the via conductor 14 in a plane perspective view. The first region 15a of the wiring conductor 15 can be formed by preventing the application of the metallized paste for the wiring conductor 15 on the first region 15a at a time of printing and applying the metallized paste for the wiring conductor 15 on the ceramic green sheet for the insulating substrate 11 by a printing method such as a screen printing method.

A material having a higher thermal conductivity than the insulating substrate 11, for example, a metal material, such as copper (Cu), copper-tungsten (Cu—W), or aluminum (Al), a ceramic material, such as an aluminum oxide-based sintered body, a mullite-based sintered body, an aluminum nitride-based sintered body, or a silicon carbide-based sintered body, or the like can be used for the heat dissipation portion 17. For example, in a case where the material of the insulating substrate 11 is an aluminum oxide-based sintered body, by using Cu—W as the material for the heat dissipation portion 17, i.e., by using a material with a higher thermal conductivity than the insulating substrate 11 for the heat dissipation portion 17, the heat generated by the electronic component 2 mounted on the mounting portion 11a of the insulating substrate 11 is dissipated in an excellent manner via the heat dissipation portion 17. Thus, the wiring board 1 with excellent heat dissipation can be obtained. Furthermore, by joining the bottom surface of the heat dissipation portion 17 to a conductor or the like of the module board, it is possible to improve the heat dissipation of the electronic device.

The heat dissipation portion 17 improves the heat dissipation of the wiring board 1 by releasing the heat generated at the electronic component 2 mounted on the wiring board 1 to the outside of the wiring board 1, and may be a metal body or a heat dissipation conductor group. The heat dissipation portion 17 illustrated in the example illustrated in FIGS. 1 to 3 is a metal body.

The upper end and lower end of the heat dissipation portion 17 are located in the thickness direction of the insulating substrate 11. The heat dissipation portion 17 has a circular columnar shape. The heat dissipation portion 17 is formed at a position overlapping the mounting portion 11a of the electronic component 2 in a plane perspective view. The heat dissipation portion 17 includes Cu—W as a main component.

After a hole has been provided in the ceramic green sheet for the insulating substrate 11 via punching via a die or punch or laser processing, a metal paste for the heat dissipation portion 17 is disposed in the hole or a metallized sheet for the heat dissipation portion 17 is disposed in the hole to produce the heat dissipation portion 17.

The heat dissipation portion 17 is made of a metallized metal powder including CuW as a main component. The metal powder may be a mixture or an alloy. For example, a metallized paste for the heat dissipation portion 17 is produced by adding an organic binder, an organic solvent, and, as necessary, a dispersing agent to a W metal powder and a Cu metal powder, and a hole formed in the ceramic green sheet is filled with the metallized paste by printing by a screen printing method or the like. Alternatively, the heat dissipation portion 17 can be produced by filling the hole formed in the ceramic green sheet with a metallized sheet for the heat dissipation portion 17. In the component constituting the heat dissipation portion 17, CuW, which is the main component, has the highest content. Furthermore, in the component constituting the heat dissipation portion 17, it is sufficient that the amount of CuW be 50 mass % or greater, and the amount of CuW may be 80 mass % or greater.

In addition, as in the example illustrated in FIGS. 2 and 3, a metal layer 18 may be located at an upper end portion and a bottom end portion of the heat dissipation portion 17 in the thickness direction of the insulating substrate 11 so as to overlap with the heat dissipation portion 17 in a plane perspective view. Similar to the heat dissipation portion 17, the metal layer 18 may include CuW as a main component.

The metal layer 18 is produced by printing, using a screen printing method or the like, the metallized paste for a metal layer 18 formed by the similar method as that of the heat dissipation portion 17 so that the metallized paste for the metal layer 18 overlaps the metallized paste for the heat dissipation portion 17 embedded in the ceramic green sheet. Furthermore, in the component constituting the metal layer 18, it is sufficient that the amount of CuW be 50 mass % or greater, and the amount of CuW may be 80 mass % or greater.

A metal plating layer is deposited using an electroplating method or an electroless plating method on surfaces of the surface electrodes 13 and the wiring conductors 15 exposed from the insulating substrate 11. The metal plating layer is made from a metal, such as nickel, copper, gold, or silver, that has superior corrosion resistance and connectivity with a connecting member. For example, a nickel plating layer approximately from 0.5 to 5 µm thick and a gold plating layer approximately from 0.1 to 3 µm thick are sequentially deposited. As a result, corrosion of the surface electrodes 13 and the wiring conductors 15 can be effectively suppressed. Additionally, this enables strengthening of the bonds between the wiring conductors 15 and connecting members 3 such as bonding wires and the bonds between the surface electrodes 13 and the wiring conductors 15 and the connection pads for connecting formed on the module board.

Furthermore, the metal plating layer is not limited to a nickel plating layer/gold plating layer, and may be another metal plating layer including a nickel plating layer/palladium plating layer/gold plating layer, or the like.

The electronic component 2 can be mounted on the mounting portion 11a located in the center portion of the wiring board 1 to produce an electronic device. The electronic component 2 mounted on the wiring board 1 may be a semiconductor element, such as an IC chip or an LSI chip, an imaging element, such as a charge coupled device (CCD) or a complementary metal oxide semiconductor (CMOS), a light-emitting element, such as a laser diode (LD) or a light-emitting diode (LED), or a light-receiving element such as a photo diode (PD). For example, in a case where the electronic component 2 is a flip-chip electronic component 2, the electronic component 2 is mounted on the wiring board 1 by electrically and mechanically connecting electrodes of the electronic component 2 and the wiring conductors 15 via the connecting members 3, such as a solder bump, a gold bump, a conductive resin (anisotropic conductive resin or similar), or the like. For example, in a case where the electronic component 2 is a wire-bonding semiconductor element, the semiconductor element is fixed on the mounting portion 11a of the wiring board 1 with a bonding member such as a low-melting point brazing material or a conductive resin and then the electrodes of the semiconductor element are electrically connected with the wiring conductors 15 via the connecting members 3 such as a bonding wire, which results in the semiconductor element being disposed on the wiring board 1. As described above, the electronic component 2 is electrically connected to the wiring conductors 15.

In addition, a plurality of the electronic components 2 may be mounted on the mounting portion 11a of the wiring board 1. Where necessary, small electronic components, such as resistance elements or capacitive elements or other components such as mirrors may also be mounted around the electronic components 2. When a plurality of electronic components 2 are mounted on the mounting portion 11a of the wiring board 1, the region surrounding the plurality of electronic components 2 in a plan view may be considered as the mounting portion 11a. As needed, the electronic component 2 is encapsulated with an encapsulation member such as resin or glass, or that is sealed with a lid made of resin, glass, ceramics, or metal.

The wiring conductors of the electronic device of the present embodiment are, for example, connected to the connection pads of the module board via a solder, thus forming an electronic module. In the electronic device, the surface electrodes 13 located on the inner surface of the recessed portions 12 and the wiring conductors 15 located on the bottom surface of the wiring board 1 are connected to the connection pads of the module board.

The wiring board according to the present embodiment includes the insulating substrate 11 including the first surface, having a rectangular shape in a plan view of the first surface, and including the mounting portion 11a for the electronic component 2 on the first surface, the via conductors 14 located inside the insulating substrate 11 and at corner portions in a plane perspective and extending in the thickness direction of the insulating substrate 11, the wiring conductors 15 located on the first surface and connecting the mounting portion 11a and the via conductors 14 to each other, and the heat dissipation portion 17 located inside the insulating substrate 11 at a position overlapping the mounting portion 11a in a plane perspective view. The first surface includes, between the heat dissipation portion 17 and the via conductors 14 in a plane perspective view, the first regions 15a surrounded by the wiring conductors 15 in a plan view. According to the configuration described above, the transfer of the heat of the electronic component 2 to the via conductors 14 via the wiring conductors 15 is suppressed, and heat transfer to the heat dissipation portion 17 is further facilitated. Thus, when heat and current are applied to the wiring conductors 15 and the via conductors 14 and these are used for a long period of time, disconnection at the connection portions of the wiring conductors 15 and the via conductors 14 can be suppressed.

Moreover, in a plane perspective view, when each first region 15a of the wiring conductor 15 is located closer to the via conductor 14 than to the heat dissipation portion 17, the transfer of the heat of the electronic component 2 to the via conductor 14 via the wiring conductor 15 is further suppressed, and heat transfer to the heat dissipation portion 17 is further facilitated. As a result, when heat and current are applied to the wiring conductors 15 and the via conductors 14 and these are used for a long period of time, disconnection at the connection portions of the wiring conductors 15 and the via conductors 14 can be suppressed.

As in the example illustrated in FIG. 1A, in a plane perspective view, when a distance in a direction perpendicular to a virtual straight line M connecting a center portion of the via conductor 14 and a center portion of the heat dissipation portion 17, is smaller in the first region 15a than in the dissipation portion 17 (W2<W1), it becomes easier to position the first region 15a on the via conductor 14 side. Thus, the transfer of the heat of the electronic component 2 to the via conductors 14 via the wiring conductors 15 is efficiently suppressed, and heat transfer to the heat dissipation portion 17 is further facilitated. As a result, when heat and current are applied to the wiring conductors 15 and the via conductors 14 and these are used for a long period of time, disconnection at the connection portions of the wiring conductors 15 and the via conductors 14 can be suppressed. Note that in the case where a plurality of the via conductors 14 are provided as in the example illustrated in FIG. 5 described below, the center portion of the via conductor 14 described above corresponds to a center portion of the plurality of via conductors 14.

Moreover, in a plane perspective view, by the wiring conductors 15 being located on the corner portion sides of the insulating substrate 11 where the via conductors 14 are located, even when the heat of the electronic component 2 transfers via the wiring conductors 15 toward the via conductors 14, the heat is transferred to the regions between both side portions of the wiring conductors 15 on the corner portion sides of the insulating substrate 11. Thus, the transfer of the heat to the via conductors 14 is further suppressed, and heat transfer to the heat dissipation portion 17 is further facilitated. As a result, when heat and current are applied to the wiring conductors 15 and the via conductors 14 and these are used for a long period of time, disconnection at the connection portions of the wiring conductors 15 and the via conductors 14 can be suppressed.

In addition, when the via conductor 14 (second via conductor), the wiring conductor 15 (second wiring conductor), and the first region 15a (second region) are located on the opposite side of the heat dissipation portion 17 from the via conductor 14 (first via conductor), the wiring conductor 15 (first wiring conductor), and the first region 15a, the transfer of the heat of the electronic component 2 to the respective via conductors 14 (the first via conductor and the second via conductor) via the wiring conductors 15 is suppressed because the via conductors 14 are located far away from one another. When these are used for a long period of time, disconnection at the connection portions of the wiring conductors 15 and the via conductors 14 can be suppressed.

In addition, in a case where the insulating substrate 11 includes the recessed portions 12 in the second surface connecting to the first surface, the recessed portions 12 include the surface electrodes 13, and the wiring conductors 15 are connected to the mounting portion 11a and the via conductors 14, as well as the surface electrodes 13, the heat of the electronic component 2 transferred via the wiring conductors 15 is transferred more to the heat dissipation portion 17 and is also transferred to the surface electrodes 13. This further suppresses heat transfer to the via conductors 14. Thus, when heat and current are applied to the wiring conductors 15 and the via conductors 14 and these are used for a long period of time, disconnection at the connection portions of the wiring conductors 15 and the via conductors 14 can be suppressed.

Furthermore, the thermal conductivity of the surface electrodes 13 may be greater than the thermal conductivity of the via conductors 14. According to the foregoing, heat transfer toward the via conductors 14 is suppressed, and heat transfer toward the surface electrodes 13 at the recessed portions 12 is further facilitated Thus, when heat and current are applied to the wiring conductors 15, the surface electrodes 13, and the via conductors 14 and these are used for a long period of time, cracking between the surface electrodes 13 and the via conductors 14 can be effectively suppressed. Regarding the surface electrodes 13 and the via conductors 14, the surface electrodes 13 may be, for example, metal conductors made of copper or mixed metal conductors of copper and tungsten or molybdenum, and the via conductors 14 may be metal conductors made of tungsten or molybdenum. In this manner, the thermal conductivity of the surface electrodes 13 may be made greater than the thermal conductivity of the via conductors 14. Additionally, the amount of glass powder and ceramic powder included in the surface electrodes 13 may be less than the amount of glass powder and ceramic powder included in the via conductors 14. In this manner, the thermal conductivity of the surface electrodes 13 may be made greater than the thermal conductivity of the via conductors 14.

The electronic device includes the electronic component 2 on the mounting portion 11a of the wiring board 1 having the configuration described above, and thus can be an electronic device that has excellent long-term reliability, is small and has high functionality.

Because the electronic module includes a module board and the electronic device with the configuration described above connected to the module board, excellent long-term reliability can be achieved.

Second Embodiment

A wiring board 1 according to the second embodiment will be described next with reference to FIGS. 4 to 6.

The wiring board 1 according to the second embodiment differs from the wiring board 1 according to the above-described embodiment in that the via conductors 14 are located along the outer edge of each first region 15a in a plane perspective view, and that the heat dissipation portion 17 is a heat dissipation conductor group 17G. Note that in a case where the heat dissipation portion 17 is the heat dissipation conductor group 17G, a center portion of the region including the plurality of heat dissipation conductors constituting the heat dissipation conductor group 17G may be considered as the center portion of the heat dissipation conductor group 17G, that is, the center portion of the heat dissipation portion 17.

Figure 4A:
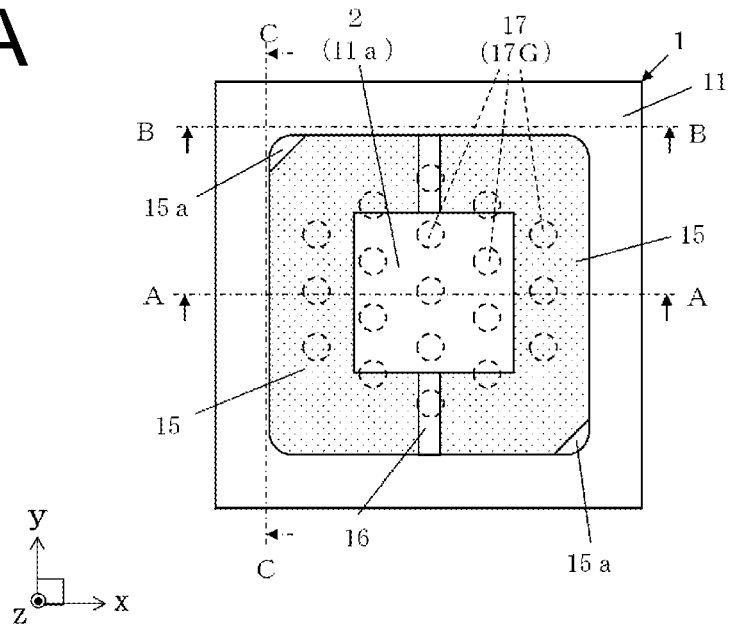
FIG. 4A is a top view of an electronic device according to a second embodiment.
Figure 4B:
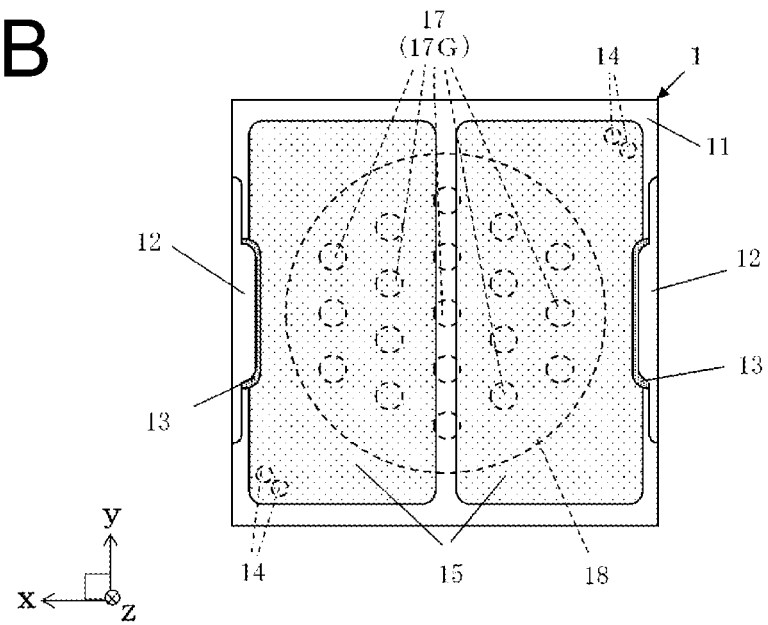
FIG. 4B is a bottom view of FIG. 4A.
Figure 5:
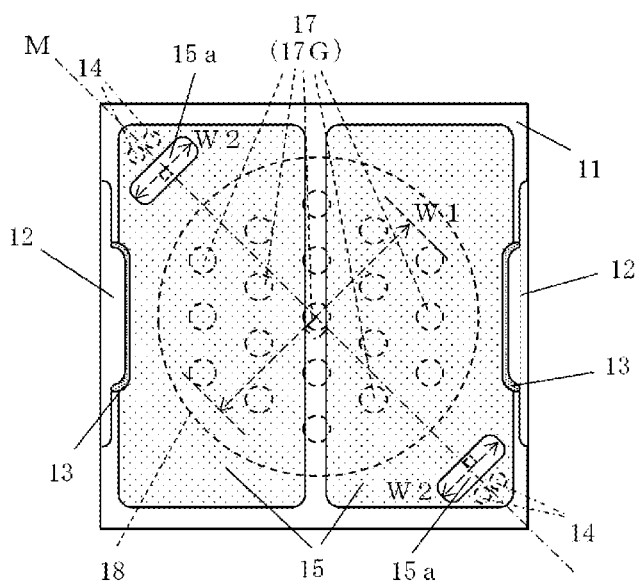
FIG. 5 is an internal top view of a wiring board in the electronic device illustrated in FIG. 4.

The surface electrodes 13 are illustrated hatched in the example illustrated in FIGS. 4 and 5. In the example illustrated in FIGS. 4 and 5, regarding the via conductors 14, regions where the side surfaces of the via conductors 14 overlap with the wiring conductors 15 are illustrated as dotted lines. The wiring conductors 15 are illustrated hatched in the examples illustrated in FIGS. 4 and 5.

In a similar manner to forming the metal body in the first embodiment, after a plurality of holes are provided in the ceramic green sheet for the insulating substrate 11 via punching via a die or punch or laser processing, a metal paste for the heat dissipation conductors is disposed in the holes to produce the heat dissipation conductor group 17G, i.e., the heat dissipation portion 17.

In a similar manner to the wiring board 1 of the embodiment described above, according to the wiring board 1 of the second embodiment, the transfer of the heat of the electronic component 2 to the via conductors 14 via the wiring conductors 15 is suppressed, and heat transfer to the heat dissipation portion 17 is further facilitated. Thus, when heat and current are applied to the wiring conductors 15 and the via conductors 14 and these are used for a long period of time, disconnection at the connection portions of the wiring conductors 15 and the via conductors 14 can be suppressed.

Moreover, by the via conductors 14 being located along the outer edges of the first regions 15a, the heat transfer toward the via conductors 14 can be dispersed, and the heat transfer toward the via conductors 14 via the wiring conductors 15 along the outer edges of the first regions 15a can be dispersed. Thus, when these are used for a long period of time, disconnection at the connection portions of the wiring conductors 15 and the via conductors 14 can be suppressed.

In a plane perspective view, the via conductors 14 are positioned on the sides forming the corner portions of the insulating substrate 11. Thus, the heat transfer from the wiring conductors 15 toward the via conductors 14 can be dispersed, and when these are used for a long period of time, disconnection at the connection portions of the wiring conductors 15 and the via conductors 14 can be suppressed.

Figure 6A:
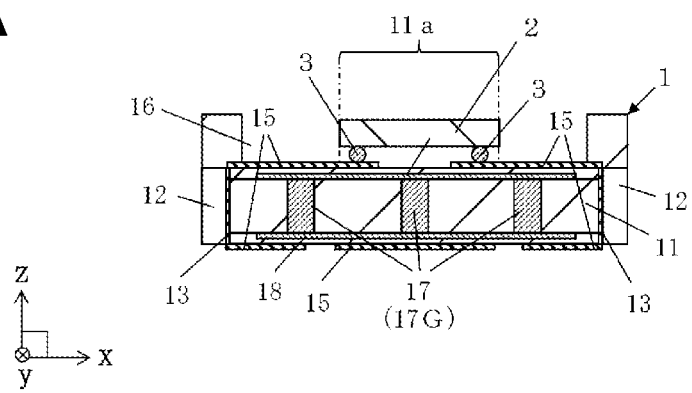
FIG. 6A is a cross-sectional view taken along line A-A of the electronic device illustrated in FIG. 4A.
Figure 6B:
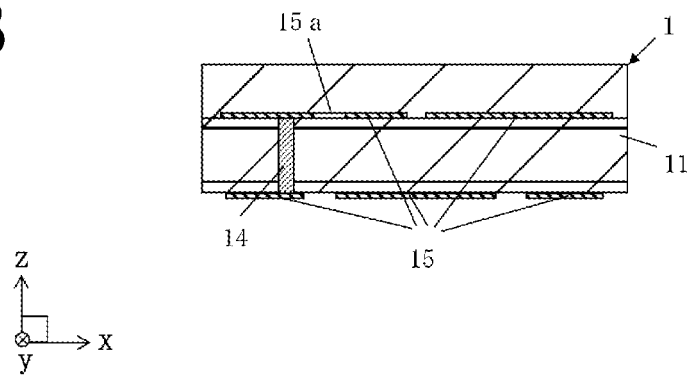
FIG. 6B is a cross-sectional view taken along line B-B of the electronic device illustrated in FIG. 4A.
Figure 6C:
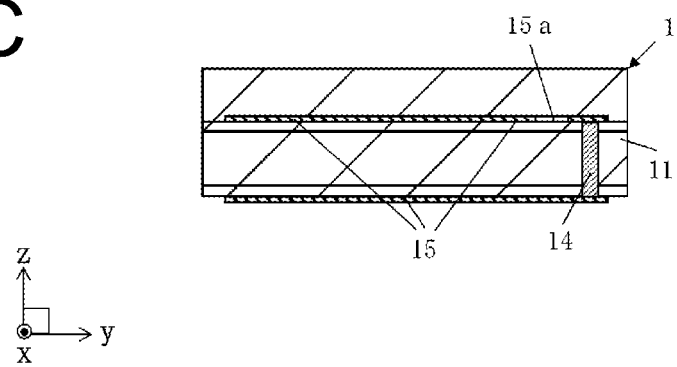
FIG. 6C is a cross-sectional view taken along line C-C of the electronic device illustrated in FIG. 4A.

In the example illustrated in FIGS. 4 to 6, two via conductors 14 are positioned along the outer edge of each first region 15a. Three or more via conductors 14 may be located along the outer edge of each first region 15a.

In a case where the plurality of via conductors 14 are positioned along the outer edge of each first region 15a, as in the example illustrated in FIGS. 4 to 6, the plurality of via conductors 14, the wiring conductor 15, and the first region 15a are positioned on each of the opposite sides of the heat dissipation portion 17, and the number of the plurality of via conductors 14 on each side may be the same.

Furthermore, the wiring board 1 includes a cavity 16 for accommodating the electronic component 2 on a top surface of the wiring board 1. As described above, as in the example illustrated in FIGS. 4 to 6, a portion of the first region 15a of the wiring conductor 15 may be positioned inward of the inner surface of the cavity 16 in a plan view and may be exposed. As described above, a portion of the first region 15a of the wiring conductor 15 is exposed, and the top surface side and the bottom surface side of the insulating substrate 11 are well laminated at the corner portion of the cavity 16, heat transfer to the side wall side of the cavity 16 around the first region 15 is good, and heat transfer toward the via conductors 14 is suppressed. When these are used for a long period of time, disconnection at the connection portions of the wiring conductors 15 and the via conductors 14 can be suppressed.

The wiring board 1 according to the second embodiment can be manufactured using the similar manufacturing method as that of the wiring board 1 of the embodiment described above.

Third Embodiment

A wiring board 1 according to the third embodiment will be described next with reference to FIGS. 7 to 9.

The wiring board 1 according to the third embodiment differs from the wiring board 1 according to the above-described embodiments in that, in a plane perspective view, the via conductors 14 are positioned at the four corner sides of the insulating substrate 11, and each wiring conductor 15 includes a first region 15a that surrounds a region located between the mounting portion 11a and the via conductor 14.

Figure 7A:
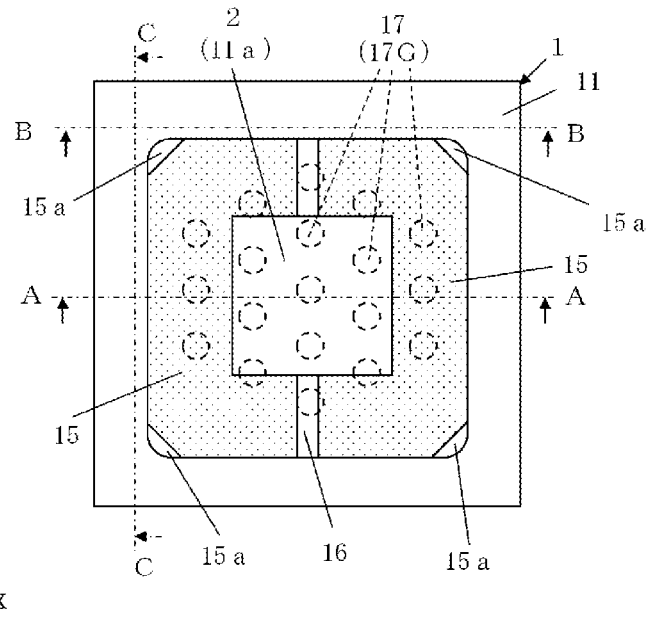
FIG. 7A is a top view of an electronic device according to a third embodiment.
Figure 7B:
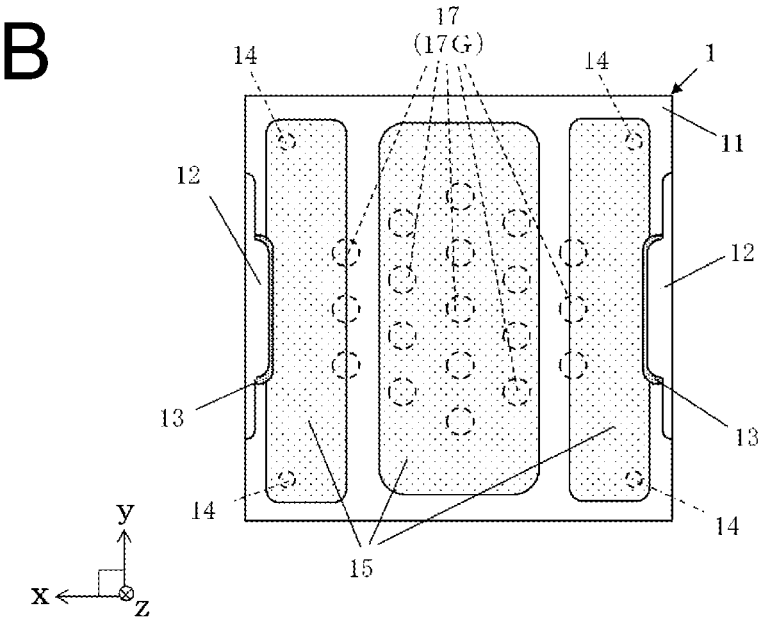
FIG. 7B is a bottom view of FIG. 7A.
Figure 8:
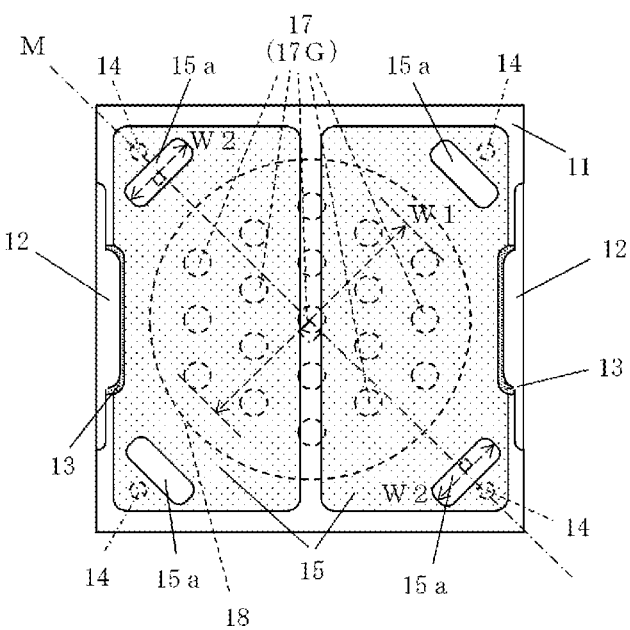
FIG. 8 is an internal top view of a wiring board in the electronic device illustrated in FIG. 7.
Figure 8:
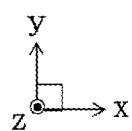
Figure 9A:
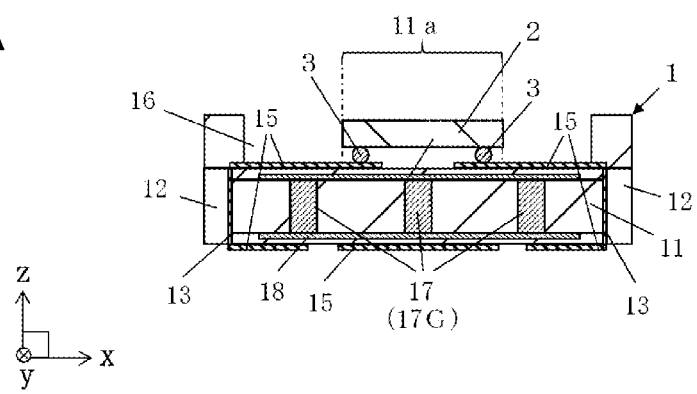
FIG. 9A is a cross-sectional view taken along line A-A of the electronic device illustrated in FIG. 7A.
Figure 9B:
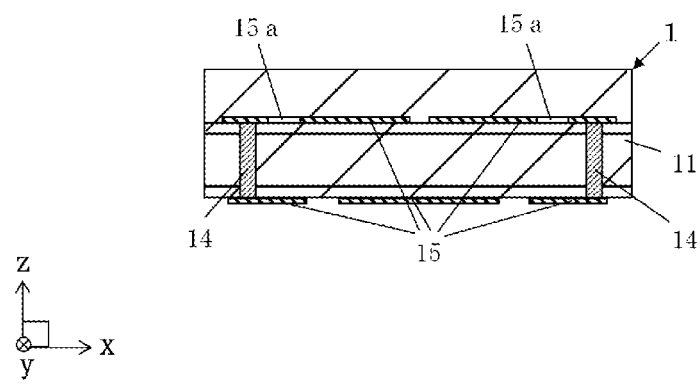
FIG. 9B is a cross-sectional view taken along line B-B of the electronic device illustrated in FIG. 7A.
Figure 9C:
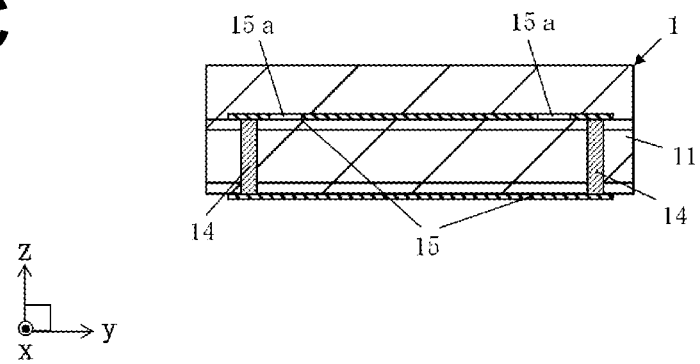
FIG. 9C is a cross-sectional view taken along line C-C of the electronic device illustrated in FIG. 7A.

The surface electrodes 13 are illustrated hatched in the example illustrated in FIGS. 7 and 8. In the example illustrated in FIGS. 7 and 8, regarding the via conductors 14, regions where the side surfaces of the via conductors 14 overlap with the wiring conductors 15 are illustrated as dotted lines. The wiring conductors 15 are illustrated hatched in the example illustrated in FIGS. 7 and 8.

In a similar manner to the wiring board 1 of the embodiments described above, according to the wiring board 1 of the third embodiment, the transfer of the heat of the electronic component 2 to the via conductors 14 via the wiring conductors 15 is suppressed, and heat transfer to the heat dissipation portion 17 is further facilitated. Thus, when heat and current are applied to the wiring conductors 15 and the via conductors 14 and these are used for a long period of time, disconnection at the connection portions of the wiring conductors 15 and the via conductors 14 can be suppressed.

Moreover, the via conductors 14 and the first regions 15a of the wiring conductors 15 are located at the four corner portions of the wiring board 1. Thus, heat transfer is improved with the heat being dispersed in the four different directions of the via conductors 14, and heat transfer toward the via conductors 14 can be suppressed. When heat and current are applied to the wiring conductors 15, the surface electrodes 13, and the via conductors 14 and these are used for a long period of time, disconnection at the connection portions of the wiring conductors 15 and the via conductors 14 can be suppressed.

As in the example illustrated in FIG. 8 in which some reference signs have been omitted, in a plane perspective view, the via conductors 14 and the first regions 15a of the wiring conductors 15 are located at the four corner portions of the wiring board 1, and the distance, in a direction perpendicular to the virtual straight line M connecting the center portion of the via conductors 14 and the center portion of the heat dissipation portion 17, is smaller in the first region 15a than in the heat dissipation portion 17 (W2<W1), thereby making it easier to position each first region 15a on the via conductor 14 side. Thus, the transfer of the heat of the electronic component 2 to the via conductors 14 via the wiring conductors 15 is efficiently suppressed, and heat transfer to the heat dissipation portion 17 is further facilitated. As a result, when heat and current are applied to the wiring conductors 15 and the via conductors 14 and these are used for a long period of time, disconnection at the connection portions of the wiring conductors 15 and the via conductors 14 can be efficiently suppressed.

The wiring board 1 according to the third embodiment can be manufactured using the similar manufacturing method as that of the wiring board 1 of the other embodiments described above.

Fourth Embodiment

A wiring board 1 according to the fourth embodiment will be described next with reference to FIGS. 10 to 12.

The wiring board 1 according to the fourth embodiment differs from the wiring board 1 according to the above-described embodiments in that, from among a first side and a second side forming the corner portion of the insulating substrate 11, the first side is provided with the recessed portion 12, and the via conductor 14 is located closer to the first side than to the second side.

Figure 10A:
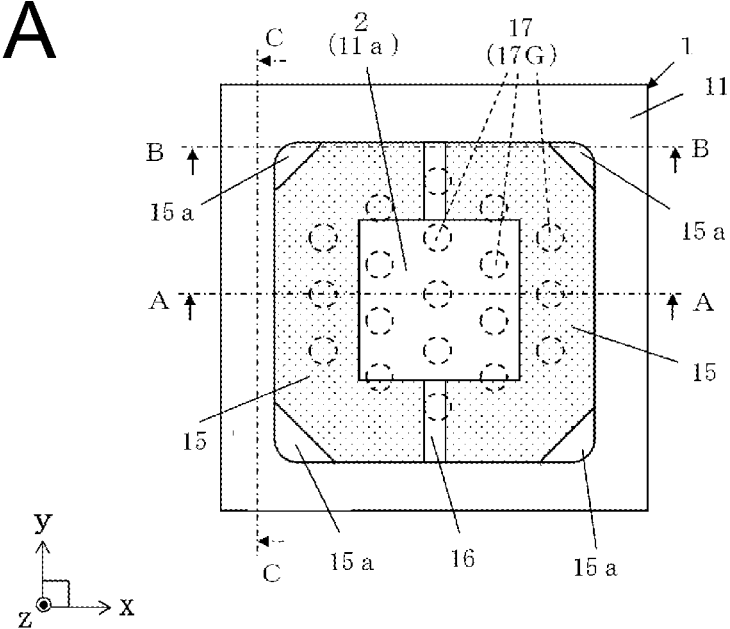
FIG. 10A is a top view of an electronic device according to a fourth embodiment.
Figure 10B:
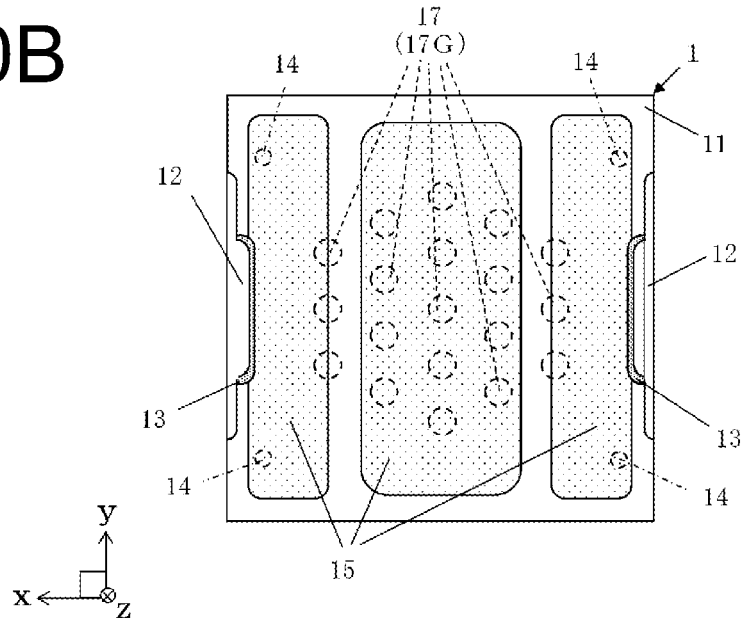
FIG. 10B is a bottom view of FIG. 10A.
Figure 11:
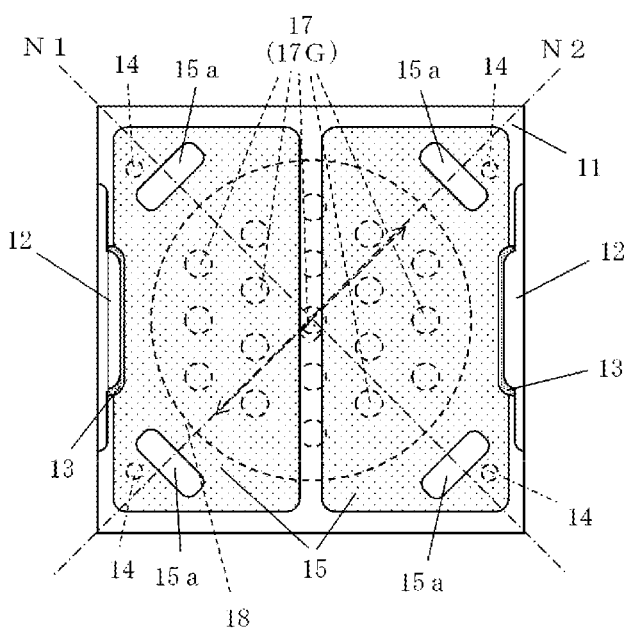
FIG. 11 is an internal top view of a wiring board in the electronic device illustrated in FIG. 10.
Figure 11:
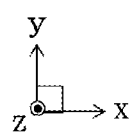
Figure 12A:
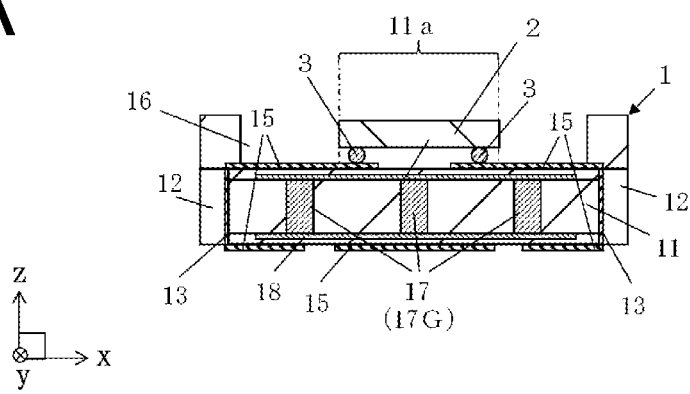
FIG. 12A is a cross-sectional view taken along line A-A of the electronic device illustrated in FIG. 10A.
Figure 12B:
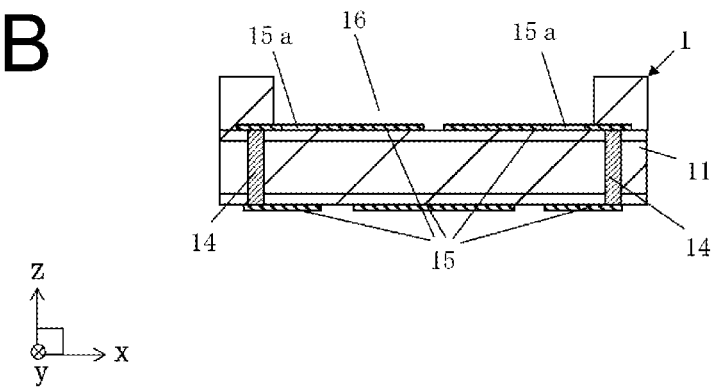
FIG. 12B is a cross-sectional view taken along line B-B of the electronic device illustrated in FIG. 10A.
Figure 12C:
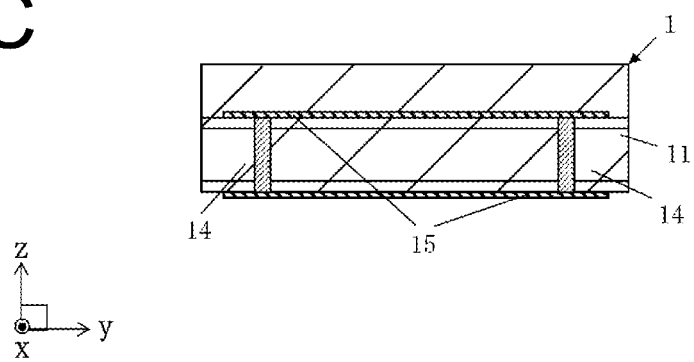
FIG. 12C is a cross-sectional view taken along line C-C of the electronic device illustrated in FIG. 10A.

The surface electrodes 13 are illustrated hatched in the example illustrated in FIGS. 10 and 11. In the example illustrated in FIGS. 10 and 11, regarding the via conductors 14, regions where the side surfaces of the via conductors 14 overlap with the wiring conductors 15 are illustrated as dotted lines. The wiring conductors 15 are illustrated hatched in the examples illustrated in FIGS. 10 and 11.

In a similar manner to the wiring board 1 of the embodiments described above, according to the wiring board 1 of the fourth embodiment, the transfer of the heat of the electronic component 2 to the via conductors 14 via the wiring conductors 15 is suppressed, and heat transfer to the heat dissipation portion 17 is further facilitated. Thus, when heat and current are applied to the wiring conductors 15 and the via conductors 14 and these are used for a long period of time, disconnection at the connection portions of the wiring conductors 15 and the via conductors 14 can be suppressed.

The fact that the via conductors 14 are located closer to the first sides than to the second sides from among the first sides, which have the recessed portions 12, and the second sides that form the corner portions of the insulating substrate 11, means that, as in the example illustrated in FIG. 11, the via conductors 14 are located closer to the surface electrodes 13 side relative to virtual straight lines N1, N2 connecting the mounting portion and the corner portions of the insulating substrate 11. Because the via conductors 14 are located close to the surface electrodes 13, the heat of the electronic component 2 is easily transferred via the wiring conductors 15 toward the surface electrodes 13. This further suppresses transfer of heat to the via conductors 14. Thus, when heat and current are applied to the wiring conductors 15 and the via conductors 14 and these are used for a long period of time, disconnection at the connection portions of the wiring conductors 15 and the via conductors 14 can be efficiently suppressed.

When the volume of the via conductors 14 located between the wiring conductors 15 on the first surface side and the wiring conductors 15 on the third surface side is less than the volume of the surface electrodes 13 located between the wiring conductors 15 on the first surface side and the wiring conductors 15 on the third surface side, current applied to the via conductors 14 is reduced. Thus, when these are used for a long period of time, disconnection at the connection portions of the wiring conductors 15 and the via conductors 14 can be suppressed.

Moreover, the via conductors 14 and the first regions 15a of the wiring conductors 15 are located at the four corner portions of the wiring board 1. Thus, heat transfer is improved with the heat being dispersed in the four different directions of the via conductors 14, and heat transfer toward the via conductors 14 can be suppressed. When heat and current are applied to the wiring conductors 15, the surface electrodes 13, and the via conductors 14 and these are used for a long period of time, disconnection at the connection portions of the wiring conductors 15 and the via conductors 14 can be suppressed.

The wiring board 1 according to the fourth embodiment can be manufactured using the similar manufacturing method as that of the wiring board 1 of other embodiments described above.

The present invention is not limited to the above-described embodiments, and various modifications are applicable. For example, the insulating substrate 11 may have a rectangular shape with cutouts or rounded corners at the side surfaces or corner portions in a plan view.

In the wiring board 1 according to the second to fourth embodiments, in a longitudinal cross-sectional view, the inner surface of the cavity 16 is perpendicular to the top surface of the insulating substrate 11. However, the inner surface of the cavity 16 may be inclined so that the cavity 16 is wider at the opening side than the bottom surface side.

Furthermore, regarding the wiring board 1 according to the first to fourth embodiments, the configurations of different embodiments may be combined. For example, in the wiring board 1 according to the first embodiment, similar to the wiring board 1 according to the third embodiment, the via conductors 14 and the first regions 15a of the wiring conductors 15 may be located at the four corner sides of the wiring board 1.

Moreover, in the wiring board 1 according to the fourth embodiment, similar to the wiring board 1 according to the first embodiment, the heat dissipation conductor group 17G may be used for the wiring board 1 provided with the single heat dissipation portion 17.

Furthermore, in the wiring board 1 according to the first embodiment, similar to the wiring board 1 according to the second and third embodiments, the cavity 16 may be provided.

Additionally, the wiring board 1 may also be manufactured as a multipiece board.

The invention claimed is:

1. A wiring board comprising:
an insulating substrate comprising a first surface and a mounting portion for an electronic component on the first surface, the insulating substrate having a rectangular shape in a plan view of the first surface;
a via conductor located inside the insulating substrate and at a corner portion of the insulating substrate in a plane perspective view, the via conductor extending in a thickness direction of the insulating substrate;
a wiring conductor located on the first surface and connecting the mounting portion and the via conductor to each other; and
a heat dissipation portion located inside the insulating substrate at a position overlapping the mounting portion in a plane perspective view, wherein
the first surface comprises a first region surrounded by the wiring conductor in a plan view, the first region located between the heat dissipation portion and the via conductor in a plane perspective view, wherein the insulating substrate comprises a recessed portion on a second surface connected to the first surface,
the recessed portion comprises a surface electrode, and
the wiring conductor is connected to the surface electrode, as well as to the mounting portion and the via conductor.

2. The wiring board according to claim 1, wherein
in a plane perspective view, the first region is located closer to the via conductor than to the heat dissipation portion.

3. The wiring board according to claim 1, wherein
in a plane perspective view, a plurality of the via conductors located at the corner portion of the insulating substrate are located side by side in a direction orthogonal to a diagonal line of the insulating substrate.

4. The wiring board according to claim 1, wherein
in a plane perspective view, the via conductor, the wiring conductor, and the first region are each located both on a side of the heat dissipation portion.

5. The wiring board according to claim 1, wherein
the insulating substrate comprises a recessed portion on a second surface connected to the first surface,
the recessed portion comprises a surface electrode,
of a first side and a second side that form the corner portion of the insulating substrate, the recessed portion is provided at the first side, and
the via conductor is located closer to the first side than to the second side.

6. An electronic device comprising:
an electronic component on the mounting portion of the wiring board according to claim 1.

7. An electronic module comprising:
a module board; and
the electronic device according to claim 6 connected to the module board.

8. A wiring board comprising:
an insulating substrate comprising a first surface and a mounting portion for an electronic component on the first surface, the insulating substrate having a rectangular shape in a plan view of the first surface;
a via conductor located inside the insulating substrate and at a corner portion of the insulating substrate in a plane perspective view, the via conductor extending in a thickness direction of the insulating substrate;
a wiring conductor located on the first surface and connecting the mounting portion and the via conductor to each other; and
a heat dissipation portion located inside the insulating substrate at a position overlapping the mounting portion in a plane perspective view, wherein
the first surface comprises a first region surrounded by the wiring conductor in a plan view, the first region located between the heat dissipation portion and the via conductor in a plane perspective view,
the insulating substrate comprises a recessed portion on a second surface connected to the first surface,
the recessed portion comprises a surface electrode,
of a first side and a second side that form the corner portion of the insulating substrate, the recessed portion is provided at the first side, and
the via conductor is located closer to the first side than to the second side.

9. The wiring board according to claim 8, wherein
in a plane perspective view, the first region is located closer to the via conductor than to the heat dissipation portion.

10. The wiring board according to claim 8, wherein
in a plane perspective view, a plurality of the via conductors located at the corner portion of the insulating substrate are located side by side in a direction orthogonal to a diagonal line of the insulating substrate.

11. The wiring board according to claim 8, wherein
in a plane perspective view, the via conductor, the wiring conductor, and the first region are each located both on a side of the heat dissipation portion.

12. The wiring board according to claim 8, wherein
the insulating substrate comprises a recessed portion on a second surface connected to the first surface,
the recessed portion comprises a surface electrode, and
the wiring conductor is connected to the surface electrode, as well as to the mounting portion and the via conductor.

13. An electronic device comprising:
an electronic component on the mounting portion of the wiring board according to claim 8.

14. An electronic module comprising:
a module board; and
the electronic device according to claim 13 connected to the module board.

* * * * *